United States Patent
Wada et al.

(10) Patent No.: US 8,981,473 B2
(45) Date of Patent: Mar. 17, 2015

(54) DIELECTRIC ISOLATION SUBSTRATE AND SEMICONDUCTOR DEVICE

(75) Inventors: Ryo Wada, Kanagawa-ken (JP); Kaori Yoshioka, Kanagawa-ken (JP); Norio Yasuhara, Kanagawa-ken (JP); Tomoko Matsudai, Tokyo (JP); Yuichi Goto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 370 days.

(21) Appl. No.: 13/410,739

(22) Filed: Mar. 2, 2012

(65) Prior Publication Data

US 2013/0049111 A1     Feb. 28, 2013

(30) Foreign Application Priority Data

Aug. 23, 2011    (JP) ................ P2011-181489

(51) Int. Cl.
    *H01L 29/78*     (2006.01)
    *H01L 21/761*     (2006.01)
    *H01L 29/739*     (2006.01)
    *H01L 29/66*     (2006.01)
    *H01L 29/861*     (2006.01)
    *H01L 29/06*     (2006.01)
    *H01L 29/10*     (2006.01)

(52) U.S. Cl.
    CPC .......... *H01L 21/761* (2013.01); *H01L 29/7394* (2013.01); *H01L 29/7824* (2013.01); *H01L 29/66128* (2013.01); *H01L 29/8611* (2013.01); *H01L 29/0696* (2013.01); *H01L 29/1095* (2013.01); *Y10S 257/91* (2013.01)
    USPC ........... 257/335; 257/344; 257/910; 257/107; 257/E29.255; 257/632

(58) Field of Classification Search
    CPC .................. H01L 29/66128; H01L 29/7394; H01L 29/0696; H01L 29/8611
    USPC ........... 257/335, 632, 344, 107, 910, E29.255
    See application file for complete search history.

(56) References Cited

U.S. PATENT DOCUMENTS

| | | | |
|---|---|---|---|
| 5,796,125 A | 8/1998 | Matsudai et al. | |
| 6,133,617 A * | 10/2000 | Hirayama et al. | 257/483 |
| 2002/0030226 A1 | 3/2002 | Yasuhara et al. | |
| 2006/0231867 A1* | 10/2006 | Takahashi | 257/216 |

(Continued)

FOREIGN PATENT DOCUMENTS

| | | |
|---|---|---|
| JP | 04103146 A | 4/1992 |
| JP | 04-144113 | 5/1992 |
| JP | 05074667 A | 3/1993 |

(Continued)

OTHER PUBLICATIONS

Japanese Office Action dated Jul. 11, 2014, filed in Japanese counterpart Application No. 2011-181489, 6 pages (with translation).

*Primary Examiner* — Minchul Yang
(74) *Attorney, Agent, or Firm* — Patterson & Sheridan, LLP

(57) ABSTRACT

According to one embodiment, in a dielectric isolation substrate, an insulating film having a first thickness is provided on a semiconductor substrate. A semiconductor layer of a first conductivity type having a second thickness is provided on the insulating film. An impurity diffusion layer of a second conductivity type is provided partially in a lower portion of the semiconductor layer and is in contact with the insulating film.

13 Claims, 16 Drawing Sheets

(56) References Cited

U.S. PATENT DOCUMENTS

2008/0290443 A1* 11/2008 Terashima .................. 257/487
2012/0032313 A1* 2/2012 Yamamoto et al. .......... 257/657

FOREIGN PATENT DOCUMENTS

JP    06-338604    12/1994
JP    07-058319    3/1995

* cited by examiner

DIELECTRIC ISOLATION SUBSTRATE AND SEMICONDUCTOR DEVICE

CROSS REFERENCE TO RELATED APPLICATION

This application is based upon and claims the benefit of priority from the prior Japanese Patent Application No. 2011-181489, filed on Aug. 23, 2011, the entire contents of which are incorporated herein by reference.

FIELD

Embodiments described herein relate generally to a dielectric isolation substrate and a semiconductor device.

BACKGROUND

Some conventional high-withstand-voltage semiconductor elements are provided on a dielectric isolation substrate. The dielectric isolation substrate has an SOI (Silicon On Insulator) structure in which a silicon layer where elements are formed is provided on a support substrate with an insulating film in between.

Such a high-withstand-voltage semiconductor element needs a thick silicon layer having a thickness ranging from several μm to 10 μm depending on the target withstand voltage. Thus, the dielectric isolation substrate is fabricated by laminating two silicon wafers with a silicon oxide film in between and then grinding one of the silicon wafers until the thickness of the one silicon wafer reaches several μm to 10 μm.

However, when the silicon layer is thick, there is a problem that it takes a long time to diffuse impurities in the formation of a deep impurity diffusion layer extending from the front surface of the silicon layer to the silicon oxide film. Further, since the impurities are diffused also laterally, it may be difficult to obtain a desired impurity diffusion layer.

There is also a problem that it takes a long time to form an element isolation trench in the formation of a deep element isolation layer extending from the front surface of the silicon layer to the silicon oxide film. Further, it may be difficult to obtain a desired element isolation layer due to variations in etching rate.

As a result, there occurs a problem of deteriorating the element characteristics and element isolation characteristics of the high-withstand-voltage semiconductor element. Such deteriorations lower the fabrication yield and increase the fabrication cost, making stable fabrication of the high-withstand-voltage semiconductor element difficult.

DETAILED DESCRIPTION

Figures 1A, 1C:
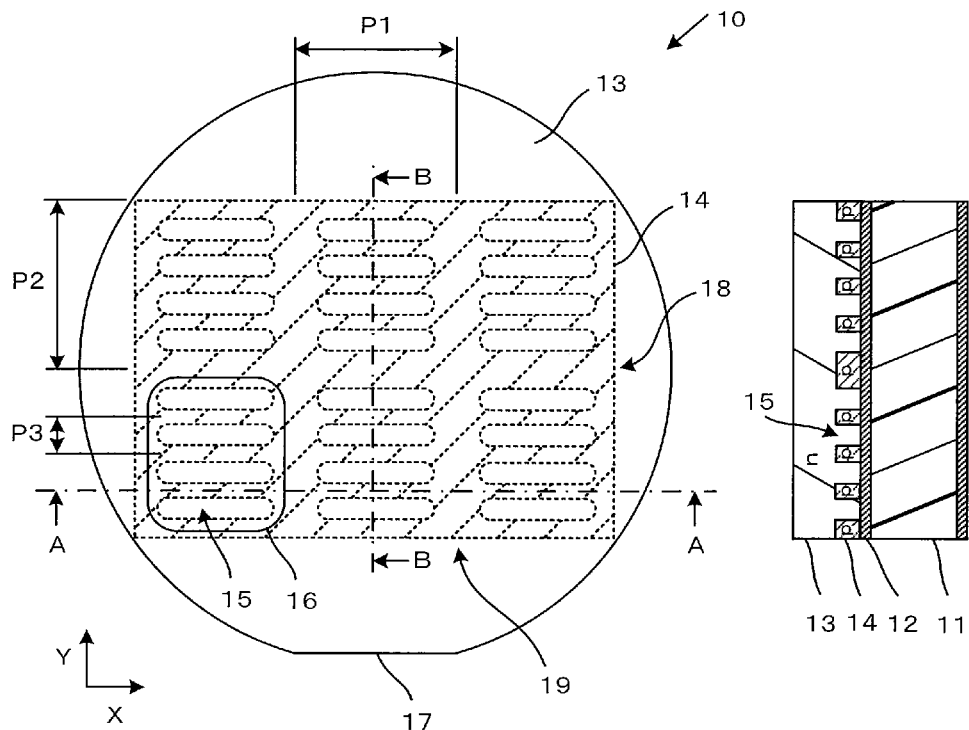
FIGS. 1A to 1C are views showing a dielectric isolation substrate according to a first embodiment.

According to one embodiment, in a dielectric isolation substrate, an insulating film having a first thickness is provided on a semiconductor substrate. A semiconductor layer of a first conductivity type having a second thickness is provided on the insulating film. An impurity diffusion layer of a second conductivity type is provided partially in a lower portion of the semiconductor layer and is in contact with the insulating film.

According to another embodiment, in a semiconductor device, a semiconductor layer of a first conductivity type is provided on a semiconductor substrate with an insulating film having a first thickness in between. The semiconductor layer has a second thickness and a first impurity concentration. A first impurity diffusion layer of the first conductivity type is provided in an upper portion of the semiconductor layer. The first impurity diffusion layer has a second impurity concentration higher than the first impurity concentration. A second impurity diffusion layer of a second conductivity type is provided in an upper portion of the semiconductor layer so as to surround the first impurity diffusion layer. The second impurity diffusion layer has a third impurity concentration. A third impurity diffusion layer of the second conductivity type is provided in a lower portion of the semiconductor layer so as to surround the first impurity diffusion layer and to be in contact with the insulating film and the second impurity diffusion layer. the third impurity diffusion layer has a fourth impurity concentration.

Hereinafter, embodiments will be described with reference to the drawings. In the drawings, same reference characters denote the same or similar portions.

First Embodiment

Figure 1B:
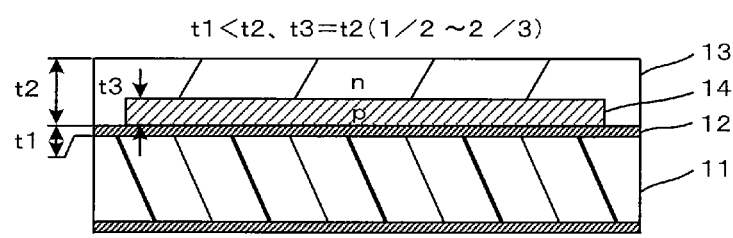

A dielectric isolation substrate of a first embodiment will be described with reference to FIGS. 1A to 3C. FIGS. 1A to 1C are views showing the dielectric isolation substrate. FIG. 1A is a plan view of the dielectric isolation substrate. FIG. 1B is a cross-sectional view of the dielectric isolation substrate taken along the A-A line and viewed in the direction of the arrows A in FIG. 1A. FIG. 1C is a cross-sectional view of the dielectric isolation substrate taken along the B-B line and viewed in the direction of the arrows B in FIG. 1A.

As shown in FIGS. 1A to 1C, in the dielectric isolation substrate 10 of the first embodiment, an insulating film 12 having a first thickness of t1 is provided on a support substrate 11. An n-type (first conductivity type) semiconductor layer 13 having a second thickness of t2 is provided on the insulating film 12. The second thickness t2 of the semiconductor layer 13 is set larger than the first thickness t1 of the insulating film 12.

The support substrate 11 is a silicon substrate having a diameter of 200 mm and a thickness of 700 µm, for example. The insulating film 12 is a thermally oxidized film of silicon having a first thickness t1 of 3 µm, for example. The semiconductor layer 13 is a silicon layer having a second thickness t2 of from 7 to 10 µm, for example.

A p-type (second conductivity type) impurity diffusion layer 14 is provided partially in a lower portion of the semiconductor layer 13. The lower surface of the impurity diffusion layer 14 is in contact with the insulating film 12. A thickness t3 of the impurity diffusion layer 14 is set to approximately ½ to ⅔ of the second thickness t2, for example.

The impurity diffusion layer 14 is provided in the dielectric isolation substrate 10 in advance so that when a deep p-type impurity diffusion layer extending from the front surface of the semiconductor layer 13 to the insulating film 12 is formed, the impurity diffusion layer 14 would become part of the deep p-type impurity diffusion layer.

The deep p-type impurity diffusion layer extending from the front surface of the semiconductor layer 13 to the insulating film 12 is one provided surrounding an n-type impurity diffusion layer with the semiconductor layer 13 in between, for example, the n-type impurity diffusion layer being provided in an upper portion of the semiconductor layer 13.

The partially provided impurity diffusion layer 14 has a pattern in which rectangular openings 15 with rounded corners are disposed in a lattice arrangement. An n-type impurity diffusion layer is provided to the semiconductor layer 13 at each of portions corresponding to the openings 15. A p-type impurity diffusion layer is provided to the semiconductor layer 13 at each of portions around the openings 15 and is connected to the impurity diffusion layer 14.

Here, four openings 15 form one unit 16. The units 16 are arranged at a pitch P1 in the direction parallel to an orientation flat 17 of the support substrate 11 (the X direction in FIG. 1A) and are arranged at a pitch P2 in a direction perpendicular to the orientation flat 17 of the support substrate 11 (the Y direction in FIG. 1A).

The openings 15 in each unit 16 are arranged at a pitch P3 in the Y direction. The gap between the adjacent units 16 in the Y direction is a dicing line 18. The gap between the adjacent units 16 in the X direction is a dicing line 19.

The dielectric isolation substrate 10 is cut along the dicing lines 18, 19 to be separated into individual chips.

In the dielectric isolation substrate 10 of the first embodiment, the impurity diffusion layer 14 is provided partially in the lower portion of the semiconductor layer 13 in advance so that the deep target impurity diffusion layer can be formed easily.

Figure 2:
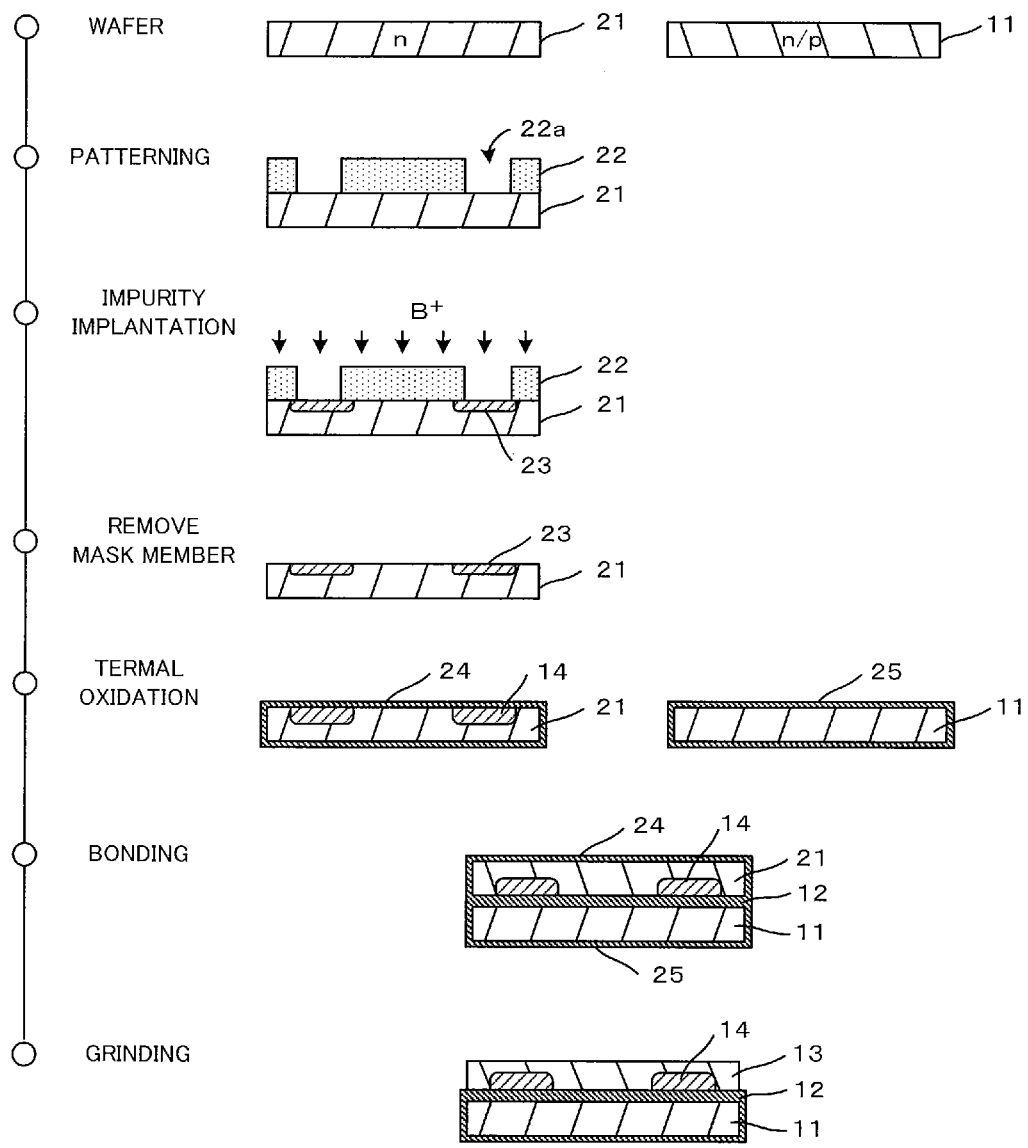
FIG. 2 is a cross-sectional view sequentially showing steps of fabricating the dielectric isolation substrate according to the first embodiment.

Next, a method of fabricating the dielectric isolation substrate 10 will be described. FIG. 2 is a cross-sectional view sequentially showing steps of fabricating the dielectric isolation substrate 10.

First, the support substrate 11 and an n-type semiconductor substrate 21 which will become the semiconductor layer 13 are prepared. The semiconductor substrate 21 is preferably in the same size as the support substrate 11. The support substrate 11 may be any of n type and p type.

A mask member 22 having an opening 22a corresponding to the pattern in the impurity diffusion layer 14 is formed on the semiconductor substrate 21 by photolithography. The mask member 22 is a resist film formed on the semiconductor substrate 21 with a silicon oxide film in between, for example.

Ions of p-type impurities such as boron (B), for example, are implanted in the semiconductor substrate 21 through the opening 22a in the mask member 22 to form an impurity implantation layer 23.

The mask member 22 is removed using an asher, for example. Thermally oxidized films 24, 25 having a thickness of approximately 1.5 µm are formed on the support substrate 11 and the semiconductor substrate 21 by thermal oxidation, respectively. The thermally oxidized films 24, 25 are formed on the back and side surfaces of the support substrate 11 and the semiconductor substrate 21 as well.

At this stage, the B in the impurity implantation layer 23 is activated and thermally diffused, whereby the impurity diffusion layer 14 is formed.

After cleaning the support substrate 11 and the semiconductor substrate 21, the support substrate 11 and the semiconductor substrate 21 are placed on top of each other with the impurity diffusion layer 14 side of the semiconductor substrate 21 facing the support substrate 11 in a clean atmosphere. At this stage, the support substrate 11 and the semiconductor substrate 21 are made capable of sticking to each other by themselves.

Further, by being heated at approximately 1000° C. in a hydrogen atmosphere, for example, the support substrate 11 and the semiconductor substrate 21 increase the bond strength and are therefore bonded to each other firmly. By this stage, the thermally oxidized films 24, 25 are united, becoming the insulating film 12.

The front surface of the semiconductor substrate 21 is ground to make the semiconductor substrate 21 thin. Further, the front surface of the semiconductor substrate 21 is planarized by CMP (Chemical Mechanical Polishing), so that the thickness of the semiconductor substrate 21 is adjusted to 7 to 10 µm. By this stage, the semiconductor substrate 21 becomes the semiconductor layer 13 having the second thickness t2.

As a result, the dielectric isolation substrate 10 is obtained which includes the impurity diffusion layer 14 shown in FIG. 1 that is provided partially in the lower portion of the semiconductor layer 13 and is in contact with the insulating film 12.

Figure 3A:
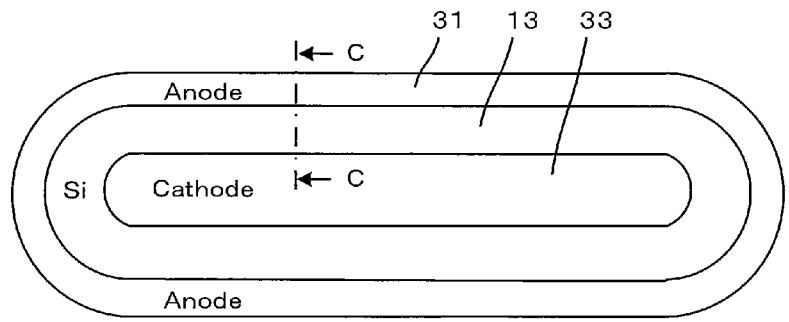
FIGS. 3A to 3C are views showing a semiconductor device according to the first embodiment.
Figure 3B:
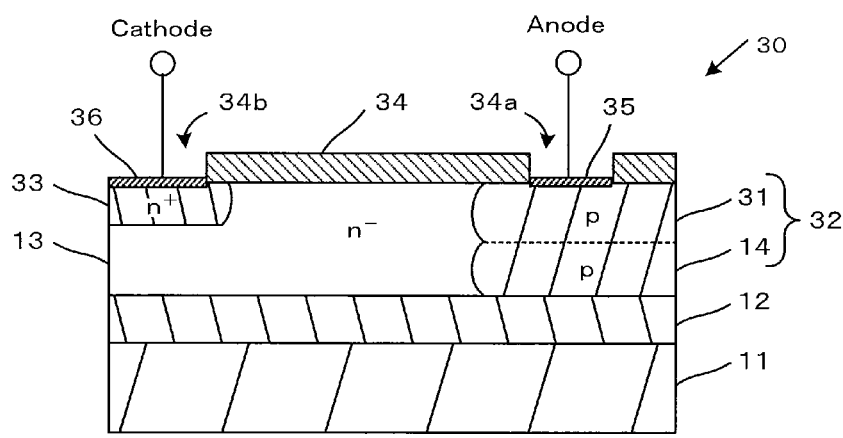
Figure 3C:
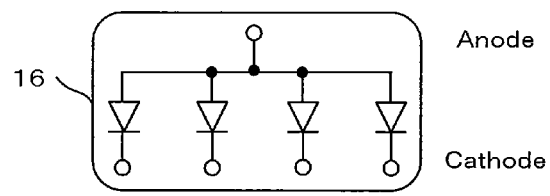

Next, a semiconductor device provided in the dielectric isolation substrate 10 will be described. FIGS. 3A to 3C are views showing the semiconductor device. FIG. 3A is a plan view showing a main portion of the semiconductor device. FIG. 3B is a cross-sectional view of the main portion taken along the C-C line and viewed in the direction of the arrows in FIG. 3A. FIG. 3C shows an equivalent circuit of the semiconductor device.

As shown in FIGS. 3A to 3C, the semiconductor device 30 of the first embodiment is a set of planar diodes provided in the dielectric isolation substrate 10.

The semiconductor device 30 is a so-called 4-in-1 semiconductor device including four diodes. The anodes of the four diodes have a common connection to each other internally while the cathodes have a common connection to each other externally through wirings (unillustrated).

FIGS. 3A and 3B show a diode provided to the portion of the semiconductor layer 13 that corresponds to one of the openings 15 in the unit 16 shown in FIG. 1. In FIG. 3A, the outer periphery of the anode is shown to follow the inner periphery for the sake of simplicity.

In the semiconductor device 30, a p-type impurity diffusion layer 31 (second impurity diffusion layer) is provided in an upper portion of the semiconductor layer 13 and extends down to the p-type impurity diffusion layer 14 (third impurity diffusion layer).

The impurity diffusion layer 31 and the impurity diffusion layer 14 are integrated with each other to make a deep impurity diffusion layer 32 extending from the front surface of the semiconductor layer 13 to the insulating film 12. The impurity diffusion layer 32 functions as an anode.

The impurity concentration of the impurity diffusion layer 31 (third impurity concentration) is approximately $1E18$ $cm^{-3}$, for example, and is set substantially equal to the impurity concentration of the impurity diffusion layer 14 (fourth impurity concentration).

An n-type impurity diffusion layer 33 (first impurity diffusion layer) is provided in an upper center portion of the semiconductor layer 13 surrounded by the impurity diffusion layer 32. The impurity diffusion layer 33 functions as a cathode.

The impurity concentration of the impurity diffusion layer 33 (second impurity concentration) is approximately $1E18$ $cm^{-3}$, for example, and is set higher than the impurity concentration of the semiconductor layer 13 (first impurity concentration), which is approximately $1E16$ $cm^{-3}$, for example.

The semiconductor layer 13 arranged between the impurity diffusion layer 32 and the impurity diffusion layer 33 is a drift layer through which electrons run, and is an element determining the withstand voltage of the semiconductor device 30. Note that the corners of each layer are rounded to prevent an electric field from concentrating at the corners and lowering the withstand voltage.

The front surface of the semiconductor layer 13 is covered with a protection film 34, which is a silicon oxide film, for example. The protection film 34 has openings 34a, 34b through which portions of the impurity diffusion layers 31, 33 are exposed, respectively. An anode metal 35, which is aluminum (Al), for example, is provided on the portion of the impurity diffusion layer 31 exposed through the opening 34a. A cathode metal 36, which is Al, for example, is provided on the portion of the impurity diffusion layer 33 exposed through the opening 34b.

Figure 4A:
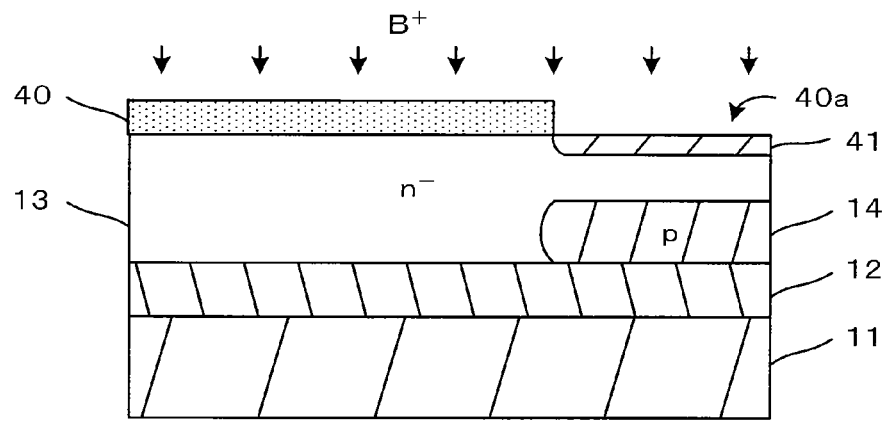
FIGS. 4A to 4C are cross-sectional views sequentially showing steps of manufacturing the semiconductor device according to the first embodiment.
Figure 4B:
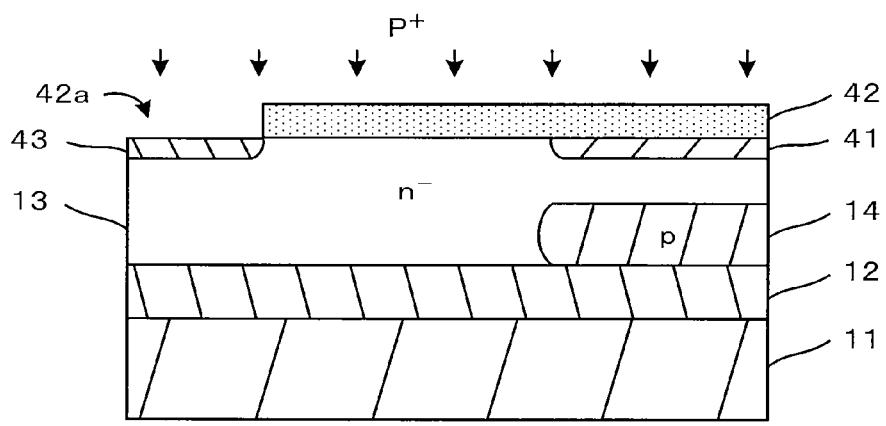
Figure 4C:
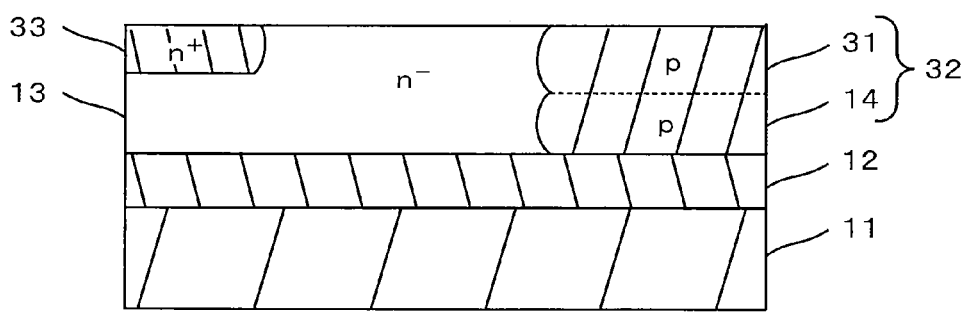

Next, a method of manufacturing the semiconductor device 30 will be described. FIGS. 4A to 4C are cross-sectional views sequentially showing steps of fabricating the semiconductor device 30.

As shown in FIG. 4A, a mask member 40 having an opening 40a corresponding to the impurity diffusion layer 31 is formed on the semiconductor layer 13 of the dielectric isolation substrate 10. Ions of B are implanted in the semiconductor layer 13 using the mask member 40 to form an impurity implantation layer 41.

As shown in FIG. 4B, after removing the mask member 40, a mask member 42 having openings 42a corresponding to the impurity diffusion layer 33 is formed on the semiconductor layer 13. Ions of phosphorus (P) are implanted in the semiconductor layer 13 using the mask member 42 to form an impurity implantation layer 43.

As shown in FIG. 4C, the implanted ions of B and P are subjected to activation heat treatment to form both the p-type impurity diffusion layer 31 connected to the impurity diffusion layer 14 and the n-type impurity diffusion layer 33 in the same process.

In the semiconductor device 30, the deep impurity diffusion layer 32 extending from the front surface of the semiconductor layer 13 to the insulating film 12 can be formed easily in a short time because the p-type impurity diffusion layer 14 is provided partially in advance in the lower portion of the semiconductor layer 13.

Figure 5:
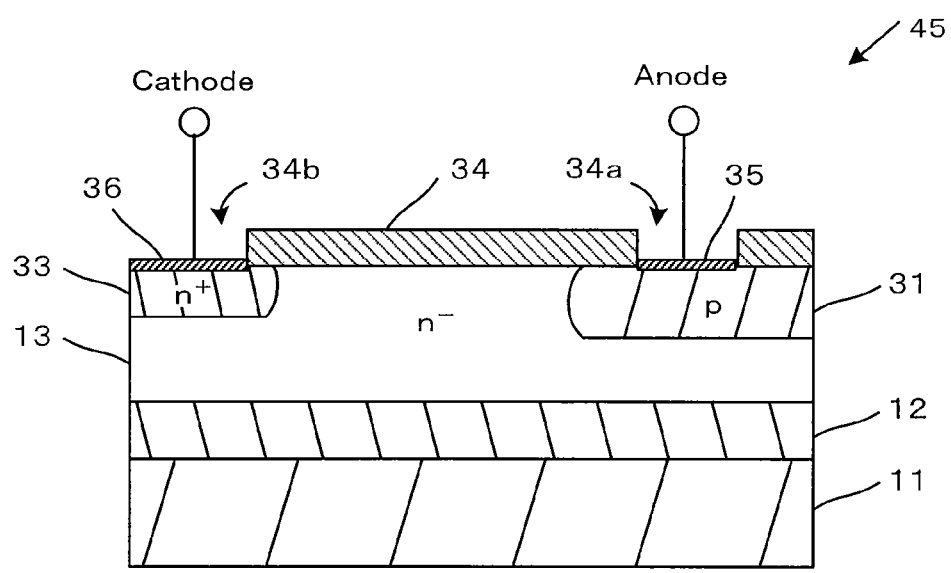
FIG. 5 is a cross-sectional view showing a semiconductor device of a comparative example according to the first embodiment.

FIG. 5 is a cross-sectional view showing a semiconductor device of a comparative example. Here, the semiconductor device of the comparative example refers to a semiconductor device provided in a dielectric isolation substrate in which the impurity diffusion layer 14 is not provided partially in advance.

As shown in FIG. 5, in the semiconductor device 45 of the comparative example, the impurity diffusion layer 31 only extends to a middle point from the front surface of the semiconductor layer 13, so that the impurity diffusion layer 32 extending down to the insulating film 12 from the front surface of the semiconductor layer 13 is not obtained.

As a result, the side and bottom surfaces of the impurity diffusion layer 31 are in contact with the semiconductor layer 13, thus increasing the area of the pn junction. In contrast, in the semiconductor device 30 of the first embodiment shown in FIGS. 3A to 3C, only the side surface of the impurity diffusion layer 32 is in contact with the semiconductor layer 13, thus reducing the area of the pn junction. Accordingly, the operating speed of the semiconductor device 30 can be improved.

Moreover, simply extending the impurity diffusion layer 31 to the insulating film 12 not only takes a long time for the heat treatment but also makes it impossible to form the impurity diffusion layer 31 and the n-type impurity diffusion layer 33 in the same process because of increasing the number of steps. Thus, it is practically difficult to simply extend the impurity diffusion layer 31 to the insulating film 12.

As described above, in the first embodiment, the dielectric isolation substrate 10 includes the impurity diffusion layer 14 that is provided partially in the lower portion of the semiconductor layer 13 and is in contact with the insulating film 12. The semiconductor device 30 includes the impurity diffusion layer 31 extending from the front surface of the semiconductor layer 13 to the impurity diffusion layer 14.

As a result, the deep impurity diffusion layer 32 extending from the front surface of the semiconductor layer 13 to the insulating film 12 can be obtained in a short time. The deep impurity diffusion layer 32 reduces the area of the pn junction, hence improving the operating speed. Thus, a dielectric isolation substrate which allows easy formation of a deep impurity diffusion layer and a semiconductor device which includes the deep impurity diffusion layer are obtained.

The above description has been given for the case where the partially provided impurity diffusion layer 14 has a pattern in which the openings 15 are disposed in a lattice arrangement. However, the pattern in which the openings 15 are disposed is not particularly limited to the above case and another pattern can be similarly available.

Moreover, the description has been given for the case where four openings 15 form one unit 16. However, the openings 15 may not form any unit, in which case the openings 15 are arranged at an equal pitch in the X direction and the Y direction, and the gap between the adjacent openings 15 serves as the dicing line 17, 18.

Furthermore, the description has been given for the case where the semiconductor device is a set of diodes. However, the semiconductor device can be another semiconductor device such as an insulated gate field effect transistor (MOS transistor) or an IGBT (Insulated Gate Bipolar Transistor), for example.

Figure 6A:
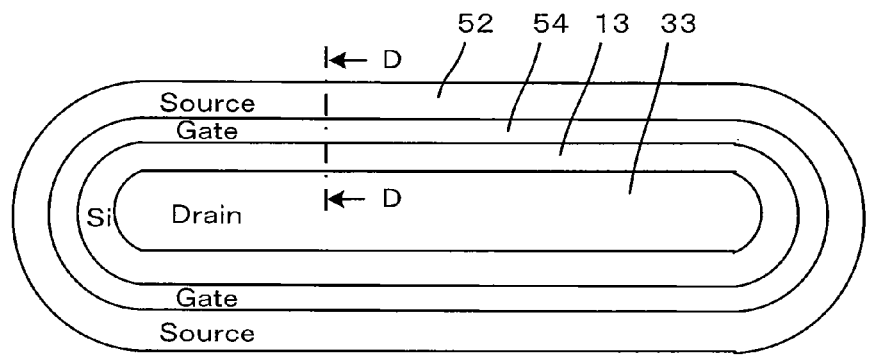
FIGS. 6A and 6B are views showing another semiconductor device according to the first embodiment.
Figure 6B:
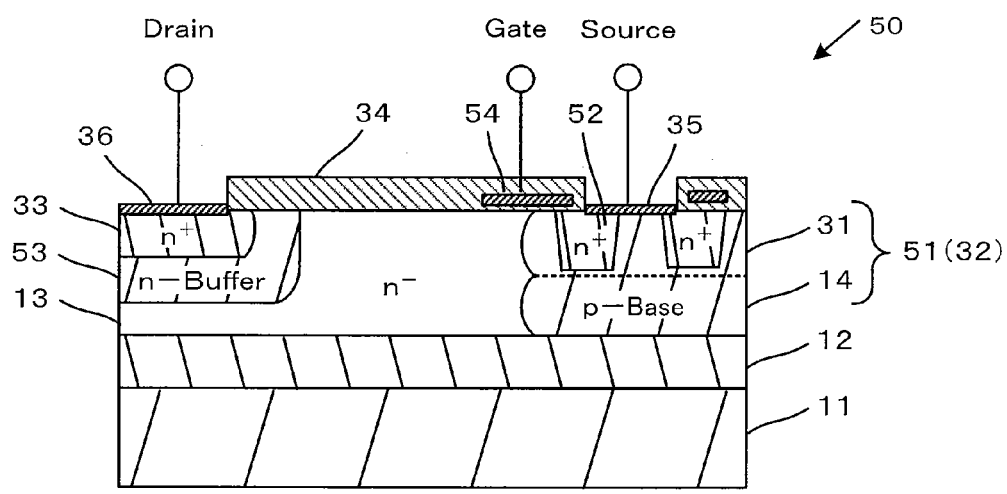

FIGS. 6A and 6B are views showing a MOS transistor provided in the dielectric isolation substrate 10. FIG. 6A is a plan view showing a main portion of the MOS transistor. FIG. 6B is a cross-sectional view of the main portion taken along the D-D line and viewed in the direction of the arrows D in FIG. 6A.

As shown in FIGS. 6A and 6B, a semiconductor device 50 is a planar, n-channel MOS transistor. In the semiconductor device 50, the deep impurity diffusion layer 32 which is formed of the impurity diffusion layers 14, 31 and extends from the front surface of the semiconductor layer 13 to the insulating film 12 functions as a p-type base layer 51.

An $n^+$-type impurity diffusion layer 52 (fourth impurity diffusion layer) is provided in a double-ring shape in an upper portion of the p-type base layer 51. The impurity diffusion layer 52 functions as a source.

The impurity diffusion layer 33 functions as a drain. An n-type buffer layer 53 (fifth impurity diffusion layer) is provided surrounding the side and bottom surfaces of the impurity diffusion layer 33. The buffer layer 53 is provided to relax the electric field between the impurity diffusion layer 33 and the semiconductor layer 13, but does not necessarily have to be provided.

The withstand voltage is determined by the impurity profiles of the impurity diffusion layer 33, the buffer layer 53, and the semiconductor layer 13. The impurity concentration of the buffer layer 53 is approximately $1E17\ cm^{-3}$, for example, and is set higher than the impurity concentration of the semiconductor layer 13 but lower than the impurity concentration of the impurity diffusion layer 33.

A gate electrode 54 is provided in such a way as to straddle a portion of the base layer 51 between the semiconductor layer 13 and the impurity diffusion layer 52, with a gate insulating film (unillustrated) in between. A channel is generated in a portion of the base layer 51 immediately below the gate insulating film.

Meanwhile, the anode metal 35 is called source metal, and the cathode metal 36 is called drain metal.

Figure 7A:
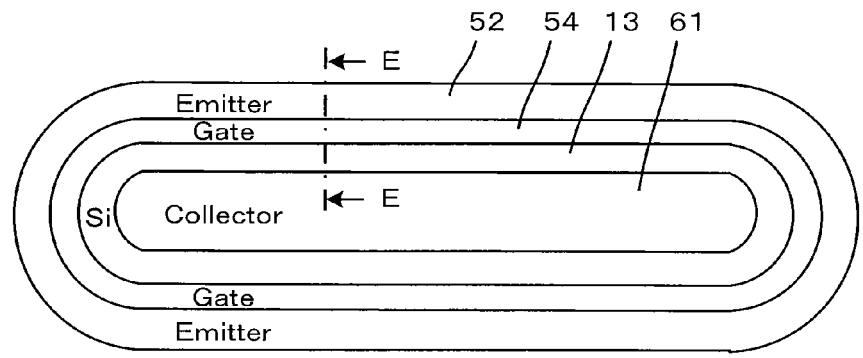
FIGS. 7A and 7B are views showing another semiconductor device according to the first embodiment.
Figure 7B:
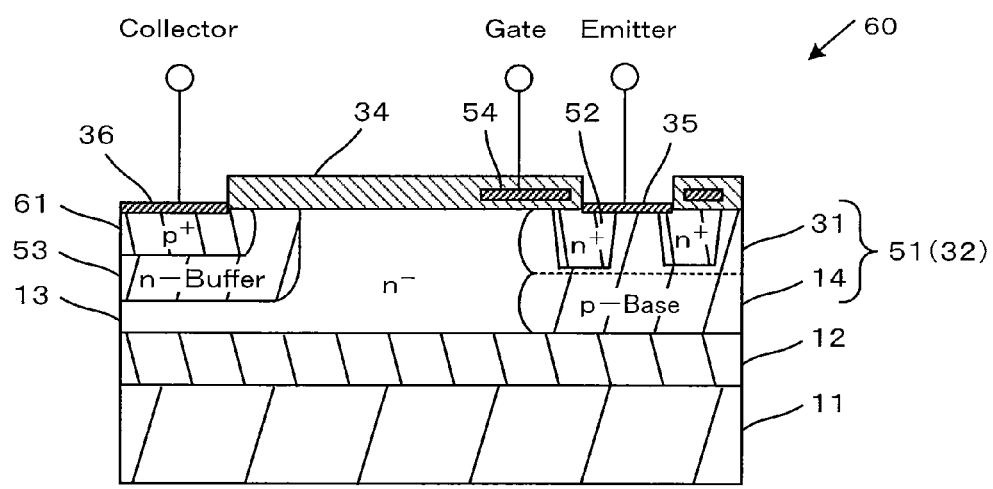

FIGS. 7A and 7B are views showing an IGBT provided in the dielectric isolation substrate 10. FIG. 7A is a plan view showing a main portion of the IGBT. FIG. 7B is a cross-sectional view of the main portion taken along the E-E line and viewed in the direction of the arrows E in FIG. 7A.

As shown in FIGS. 7A and 7B, a semiconductor device 60 is a planar IGBT. In the semiconductor device 60, the n-type impurity diffusion layer 33 shown in FIGS. 6A and 6B is replaced with a $p^+$-type impurity diffusion layer 61 (sixth impurity diffusion layer).

The $n^-$-type semiconductor layer 13, the p-type base layer 51, the $n^+$-type impurity diffusion layer 52, and the gate electrode 54 form an n-channel MOS transistor.

A $p^+$-type impurity diffusion layer 61, the n-type buffer layer 53, and the p-type base layer 51 form a pnp bipolar transistor. The $n^+$-type impurity diffusion layer 52 functions as an emitter. The $p^+$-type impurity diffusion layer 61 functions as a collector.

The n-type buffer layer 53 is provided to adjust the withstand voltage, a collector-emitter saturation voltage Vce(sat), and a time tf taken to turn off the IGBT. The trade-off between Vce(sat) and tf is adjusted in accordance with the difference in impurity concentration between the $p^+$-type impurity diffusion layer 61 and the n-type buffer layer 53. The withstand voltage is adjusted in accordance with the impurity concentration profiles of the n-type buffer layer 53 and the $n^-$-type semiconductor layer 13.

In the IGBT, the pnp bipolar transistor causes conductivity modulation to achieve low saturation voltage characteristics.

Figure 8:
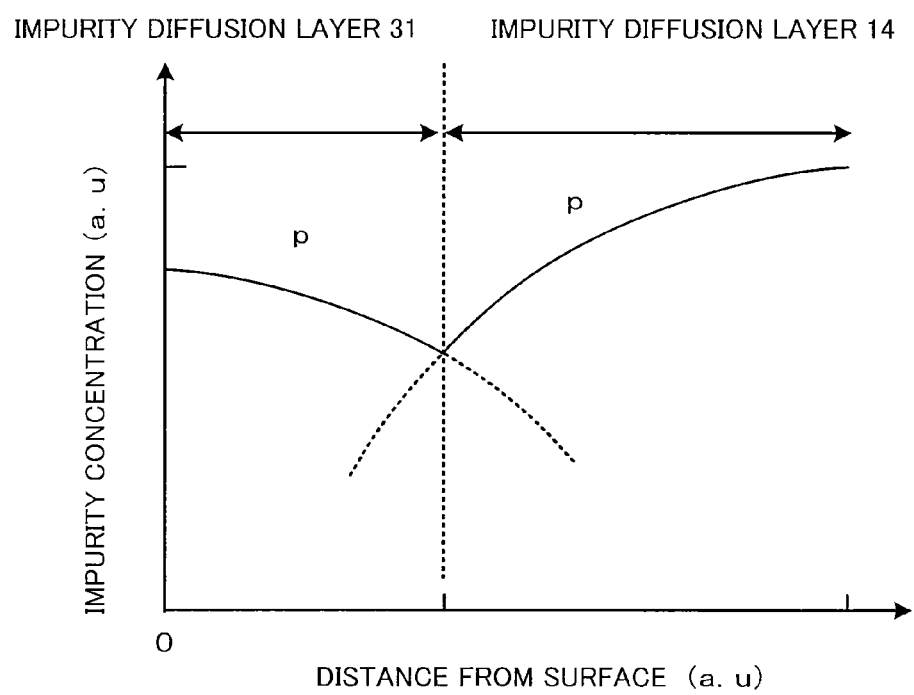
FIG. 8 is a chart showing an impurity concentration distribution of an impurity diffusion layer of the other semiconductor device according to the first embodiment.

As shown in FIG. 8, the impurity concentration of the impurity diffusion layer 14 is set higher than the impurity concentration of the impurity diffusion layer 31. An advantage that the semiconductor device 60 is less likely to latch up even when the threshold of the semiconductor device 60 is low is obtained.

The p-type impurity diffusion layer 61, the n-type buffer layer 53, the $n^-$-type semiconductor layer 13, the p-type base layer 51, and the $n^+$-type impurity diffusion layer 52 form a pnpn thyristor structure. In the structure, upon generation of a trigger current in the p-type base layer 51 by a supply voltage variation or surge voltage, latch-up occurs in which the thyristor is shifted to an ON state, and a large current keeps flowing between the collector and the emitter.

To prevent the latch-up, it is desirable to set the impurity concentration of the impurity diffusion layer 14 higher than the impurity concentration of the impurity diffusion layer 31 to lower the base resistance as much as possible.

Meanwhile, the anode metal 35 is called emitter metal, and the cathode metal 36 is called collector metal.

Figure 9:
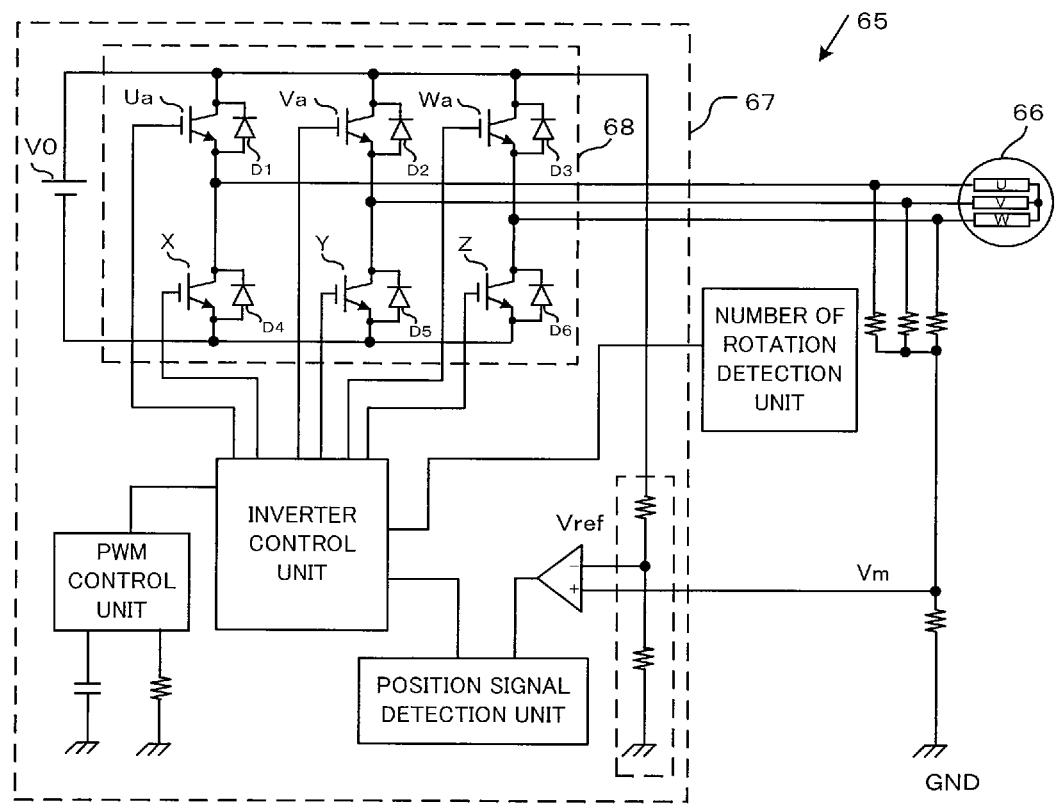
FIG. 9 is a circuit diagram showing a motor drive circuit using the semiconductor device according to the first embodiment.

FIG. 9 is a circuit diagram showing a circuit using the semiconductor devices described above. The circuit is a motor drive circuit, for example. As shown in FIG. 9, the motor drive circuit 65 uses the semiconductor devices 30 (diodes) and the semiconductor devices 60 (IGBTs). Though motor drive circuits are well known, the motor drive circuit 65 will be described briefly.

The motor drive circuit 65 includes current control means 67 to detect the position of a brushless motor 66 by comparing an induced voltage Vm of the brushless motor 66 and a reference voltage Vref, and to control the current flowing in the brushless motor 66 on the basis of the position of the brushless motor 66.

The number of rotations of the brushless motor 66 is controlled by changing the duty cycles of DC currents flowing in the armature windings U, V, W. The duty cycles are changed by performing pulse width modulation on the currents intermittently at a predetermined carrier frequency (hereinafter, the currents are referred to as PWM currents).

The current control means 67 includes an inverter circuit 68 to supply the PWM currents to the armature windings U, V, W of the brushless motor 66. In the inverter circuit 68, three series circuits of two transistors (IGBTs) are connected in parallel to a power source V0. Moreover, free-wheeling diodes D1 to D6 are connected in parallel between the collector and emitter of transistors Ua, Va, Wa, X, Y, Z, respectively.

Second Embodiment

Figure 10A:
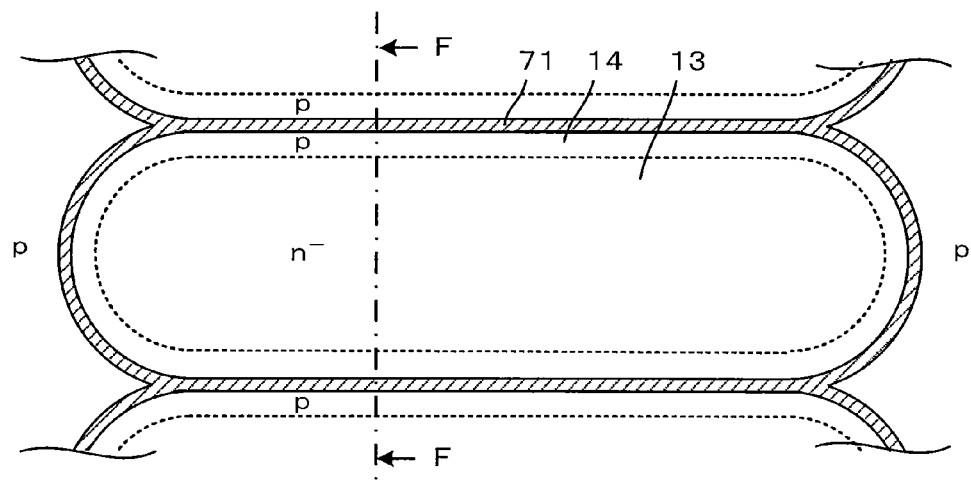
FIGS. 10A and 10B are views showing a dielectric isolation substrate according to a second embodiment.
Figure 10B:
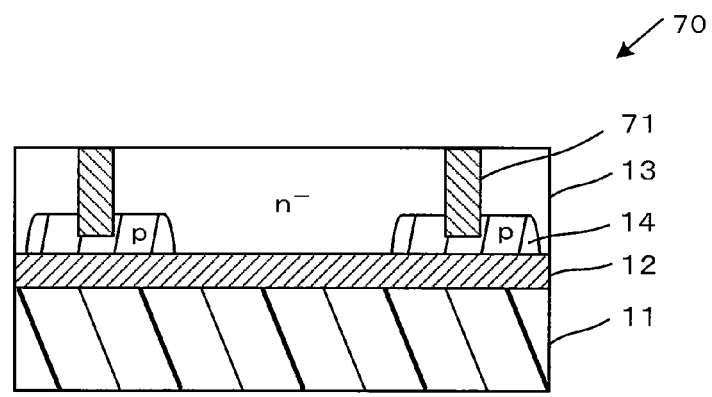

A dielectric isolation substrate of a second embodiment will be described with reference to FIGS. 10A and 10B. FIGS. 10A and 10B are views showing the dielectric isolation substrate. FIG. 10A is a plan view of the dielectric isolation substrate. FIG. 10B is a cross-sectional view of the dielectric isolation substrate taken along the F-F line and viewed in the direction of the arrows F in FIG. 10A.

In the second embodiment, the same portions as those in the first embodiment are denoted by the same reference numerals, and descriptions of the same portions are omitted. Only different portions will be described. The second embodiment differs from the first embodiment in that an element isolation layer surrounding the semiconductor layer is provided.

Specifically, as shown in FIGS. 10A and 10B, the dielectric isolation substrate 70 of the embodiment includes an element isolation layer 71 extending from the front surface of the semiconductor layer 13 to the impurity diffusion layer 14. The element isolation layer 71 is a silicon oxide film, for example.

An upper portion of the semiconductor layer 13 is electrically isolated from each adjacent semiconductor layer 13 by the element isolation layer 71. A lower portion of the semiconductor layer 13 is electrically isolated from each adjacent semiconductor layer 13 by the pn junction of the impurity diffusion layer 14 and the semiconductor layer 13.

Figure 11A:
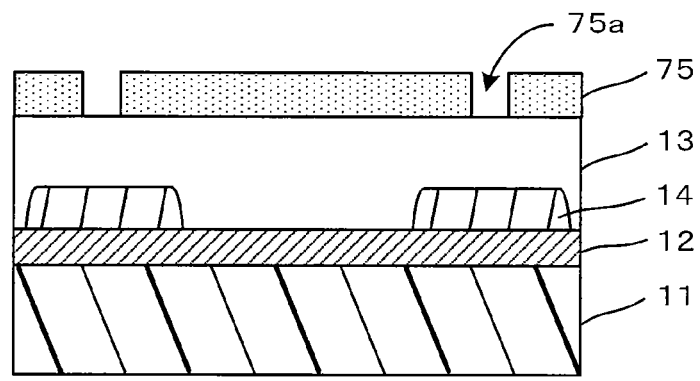
FIGS. 11A to 11C are cross-sectional views sequentially showing steps of fabricating the dielectric isolation substrate according to the second embodiment.
Figure 11B:
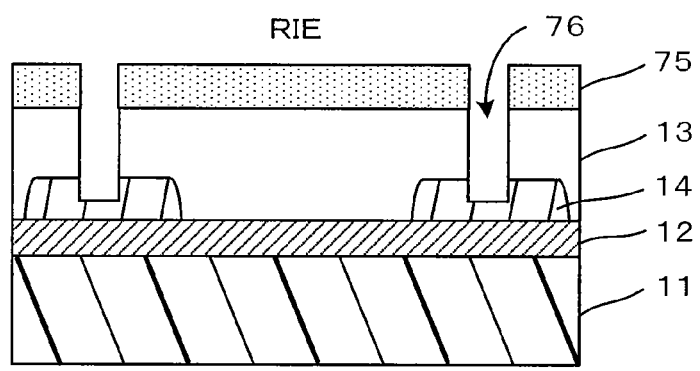
Figure 11C:
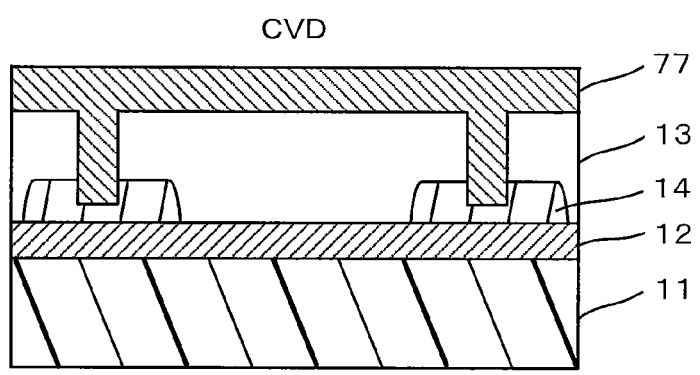

Next, a method of fabricating the dielectric isolation substrate 70 will be described. FIGS. 11A to 11C are cross-sectional views sequentially showing a main portion of steps of fabricating the dielectric isolation substrate 70.

As shown in FIG. 11A, a mask member 75 having openings 75a corresponding to the element isolation layer 71 is formed on the semiconductor layer 13.

As shown in FIG. 11B, the semiconductor layer 13 is subjected to anisotropic etching by RIE (Reactive Ion Etching) using a gas of fluorine system, for example, to form trenches 76 extending to an upper portion of the impurity diffusion layer 14.

Each trench 76 only needs to reach the impurity diffusion layer 14. Thus, the formation of the trench 76 only requires a short time and also has a sufficient margin to variations in etching rate.

As shown in FIG. 11C, a silicon oxide film 77 is formed on the semiconductor layer 13 by CVD (Chemical Vapor Deposition), for example, in such a manner as to fill the trench 76.

The silicon oxide film 77 is removed by CMP, for example, until the semiconductor layer 13 is exposed. As a result, the element isolation layer 71 shown in FIGS. 10A and 10B is formed, whereby the dielectric isolation substrate 70 is obtained.

Figure 12:
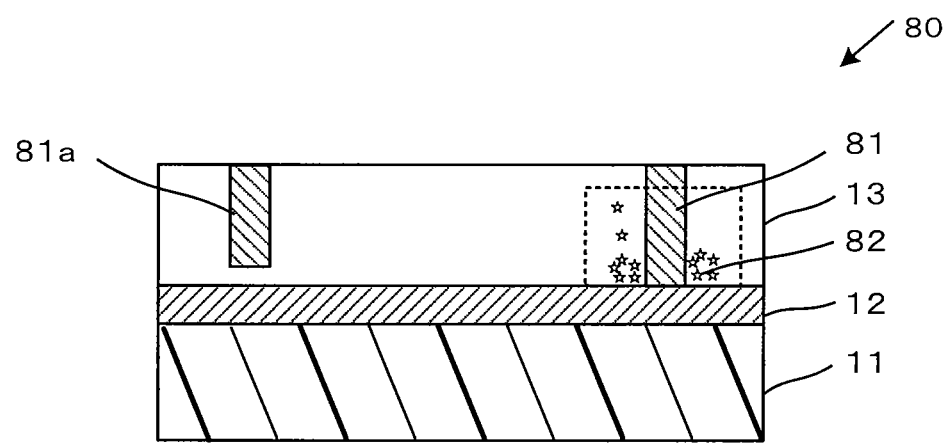
FIG. 12 is a cross-sectional view showing a dielectric isolation substrate of a comparative example according to the second embodiment.

FIG. 12 is a view showing a dielectric isolation substrate of a comparative example. Here, the dielectric isolation substrate of the comparative example refers to a dielectric isolation substrate including an element isolation layer extending from the front surface of the semiconductor layer to the insulating film.

As shown in FIG. 12, the dielectric isolation substrate 80 of the comparative example includes a deep element isolation layer 81 extending from the front surface of the semiconductor layer 13 to the insulating film 12. The element isolation layer 81 is formed by following the steps shown in FIGS. 11A to 11C, but the formation requires a long time because a deep trench is formed.

Due to variations in etching rate or the like, an element isolation layer 81a may be formed which fails to reach the insulating film 12, thereby deteriorating the element isolation characteristics.

To prevent the deterioration, sufficient etching should be performed using the insulating film 12 as a stopper. However, by the sufficient etching, an even longer time is required, and also side etching becomes no longer ignorable as well. Thus, performing the sufficient etching is practically difficult.

Further, stress is concentrated at the corners of the portions at which the element isolation layer 81 and the insulating film 12 are bonded to each other. Thus, there occurs a problem that crystal defects 82 such as slips or dislocations, for example, generate in the semiconductor layer 13 which is in the vicinity of the bonding portions enclosed by the dashed line, starting from the bonding portions.

The crystal defects 82 can be life time killers for carriers, thereby causing a possibility that the performance and reliability of the semiconductor device may be lowered.

In contrast, in the case of the dielectric isolation substrate 70 of the second embodiment shown in FIGS. 10A and 10B, the element isolation layer 71 can be formed securely in a short time. Moreover, the generation of crystal defects can be suppressed by avoiding the bond between the element isolation layer 71 and the insulating film 12.

Figure 13A:
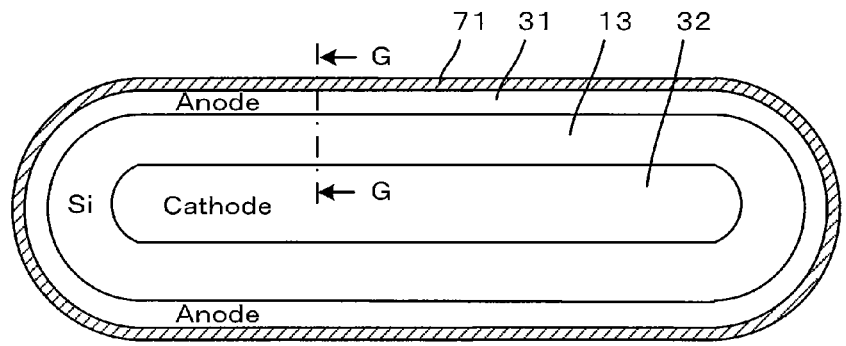
FIGS. 13A to 13C are views showing a semiconductor device according to the second embodiment.
Figure 13B:
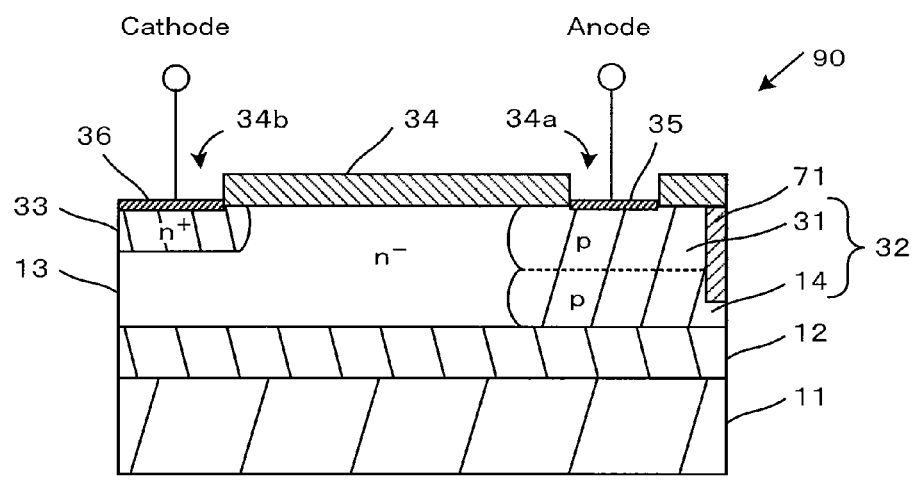
Figure 13C:
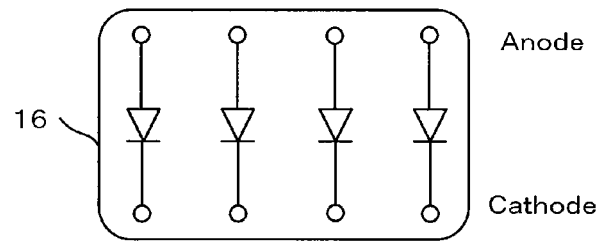

Next, a semiconductor device provided in the dielectric isolation substrate 70 will be described. FIGS. 13A to 13C are views showing the semiconductor device. FIG. 13A is a plan view of a main portion of the semiconductor device. FIG. 13B is a cross-sectional view of the main portion taken along the G-G line and viewed in the direction of the arrows G in FIG. 13A. FIG. 13C shows an equivalent circuit of the semiconductor device.

As shown in FIGS. 13A to 13C, the semiconductor device 90 of the second embodiment is a set of planar diodes provided in the dielectric isolation substrate 70.

In the semiconductor device 90, four diodes are electrically isolated from each other by the element isolation layer 71. The anode and cathode of each diode can be connected freely to external portions by wirings (unillustrated).

As described above, in the embodiment, the dielectric isolation substrate 70 includes the element isolation layer 71 surrounding the semiconductor layer 13 and extending to the impurity diffusion layer 14 that is provided in the lower portion of the semiconductor layer 13 and is in contact with the insulating film 12.

The upper portion of the semiconductor layer 13 is electrically isolated from each adjacent semiconductor layer 13 by the element isolation layer 71. The lower portion of the semiconductor layer 13 is electrically isolated from each adjacent semiconductor layer 13 by the pn junction.

There is an advantage that the element isolation layer 71 can be formed securely in a short time and that the generation of crystal defects can be suppressed by avoiding the bond between the element isolation layer 71 and the insulating film 12.

Here, the description has been given for the case where the semiconductor device is a set of diodes. However, the semiconductor device can be a different semiconductor device such as a MOS transistor or an IGBT, for example.

Figure 14A:
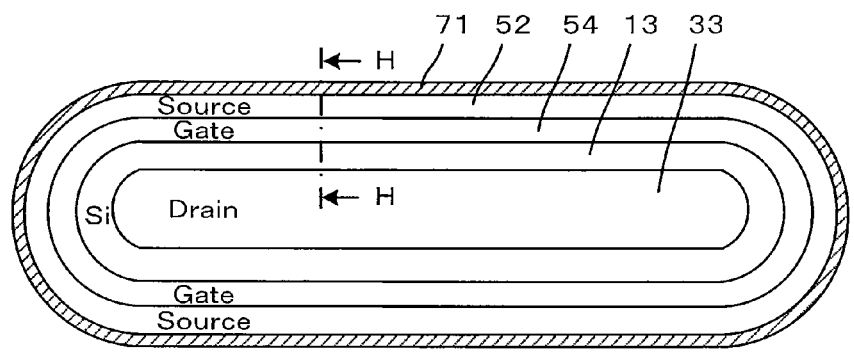
FIGS. 14A and 14B are views showing another semiconductor device according to the second embodiment.
Figure 14B:
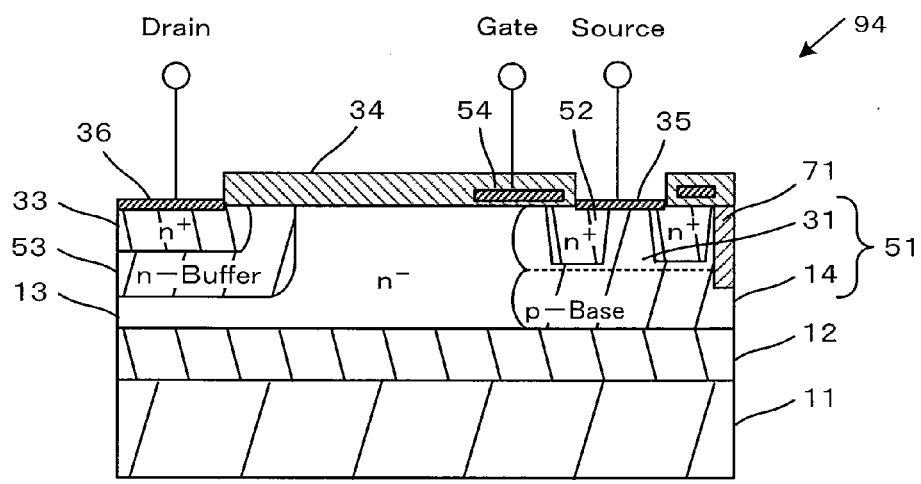

FIGS. 14A and 14B are views showing another semiconductor device provided in the dielectric isolation substrate 70. FIG. 14A is a plan view showing a main portion of the semiconductor device. FIG. 14B is a cross-sectional view of the main portion taken along the H-H line and viewed in the direction of the arrows H in FIG. 14A.

As shown in FIGS. 14A and 14B, the semiconductor device 94 is a set of planar MOS transistors. Four MOS transistors are electrically isolated from each other by the element isolation layer 71. The other features of the semiconductor device 94 are the same as the semiconductor device 50 shown in FIGS. 6A and 6B, and descriptions of the other features are omitted.

Figure 15A:
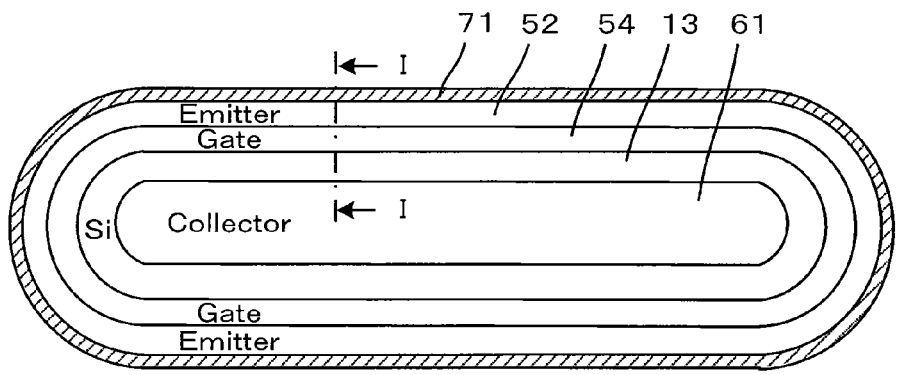
FIGS. 15A and 15B are views showing another semiconductor device according to the second embodiment.
Figure 15B:
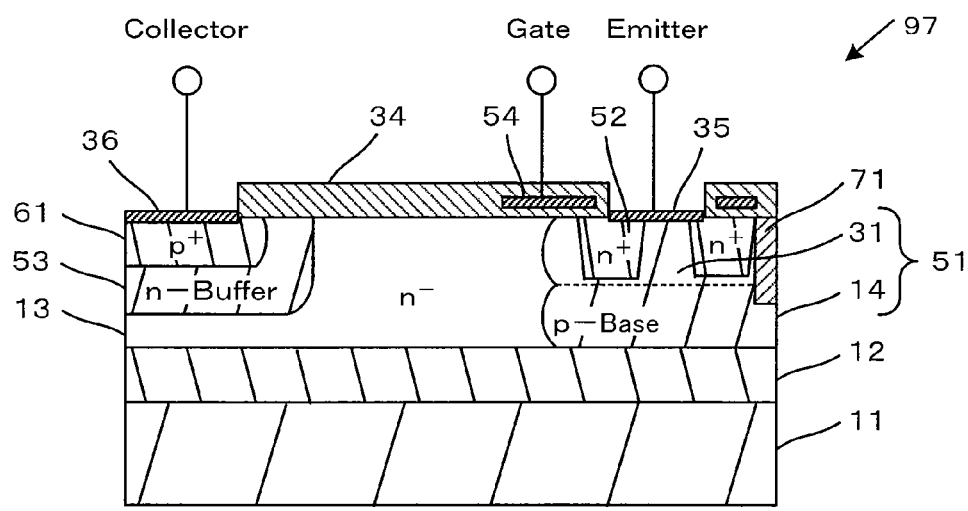

FIGS. 15A and 15B are views showing still another semiconductor device provided in the dielectric isolation substrate 70. FIG. 15A is a plan view showing a main portion of the semiconductor device. FIG. 15B is a cross-sectional view of the main portion taken along the I-I line and viewed in the direction of the arrows I in FIG. 15A.

As shown in FIGS. 15A and 15B, the semiconductor device 97 is a set of planar IGBTs. Four IGBTs are electrically isolated from each other by the element isolation layer 71. The other features of the semiconductor device 97 are the same as the semiconductor device 60 shown in FIGS. 7A and 7B, and descriptions of the other features are omitted.

The descriptions have been given for the cases where the element isolation layer is provided to surround the portions of the semiconductor layer 13 corresponding to the openings 15. However, the region to provide the element isolation layer is not particularly limited to the above case. The element isolation layer may be provided to surround the unit 16.

Figures 16A, 16C:
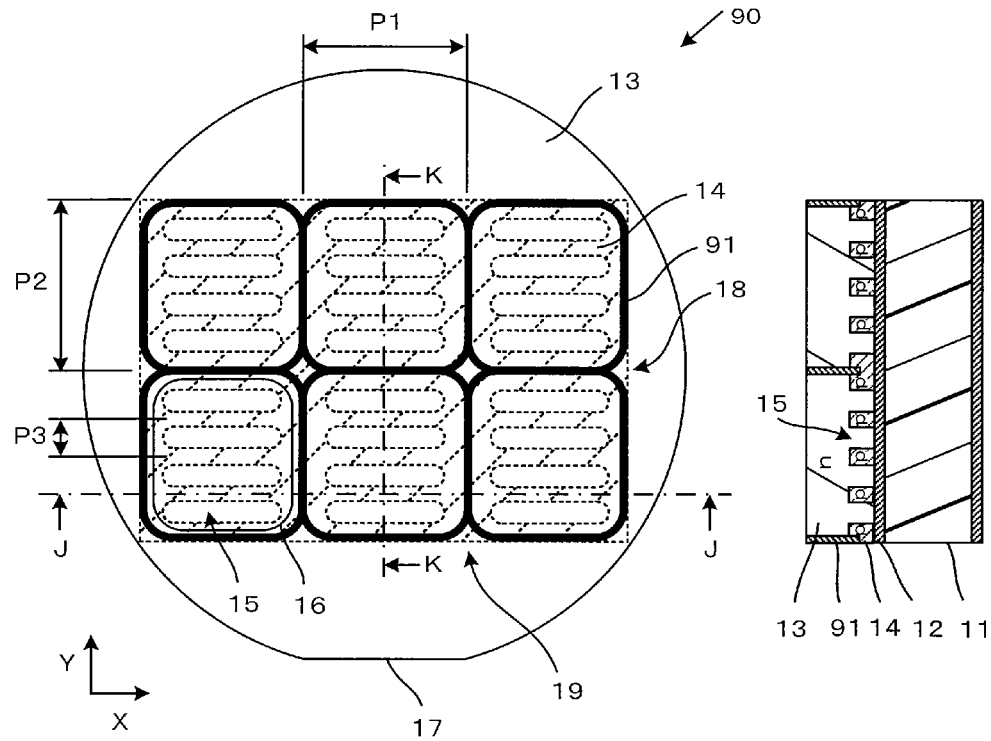
FIGS. 16A to 16C are views showing another dielectric isolation substrate according to the second embodiment.
Figure 16B:
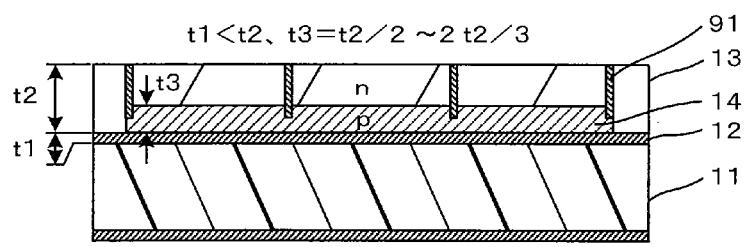

FIGS. 16A to 16C are views showing a dielectric isolation substrate including an element isolation layer surrounding each of the units 16. FIG. 16A is a plan view of the dielectric isolation substrate. FIG. 16B is a cross-sectional view of the dielectric isolation substrate taken along the J-J line and viewed in the direction of the arrows J in FIG. 16A. FIG. 16C is a cross-sectional view of the dielectric isolation substrate taken along the K-K line and viewed in the direction of the arrows K in FIG. 16A.

As shown in FIGS. 16A to 16C, the dielectric isolation substrate 90 includes an element isolation layer 91 surrounding each of the units 16. The units 16 are electrically isolated from each other by the element isolation layer 91.

In the dielectric isolation substrate 90, the IGBT shown in FIGS. 7A and 7B, for example, may be formed in each unit 16. The transistors Ua, Wa, Va, X, Y, Z in the inverter circuit 68 shown in FIG. 9 can be integrated in one chip using the adjacent six units 16.

Further, both of the diode shown in FIGS. 4A to 4C and the IGBT shown in FIGS. 7A and 7B may be formed in each unit 16. The diodes D1 to D6 can be integrated in one chip as well.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a semiconductor substrate;
    an insulating film provided on the semiconductor substrate and having a first thickness;
    a semiconductor layer of a first conductivity type provided on the insulating film and having a second thickness and a first impurity concentration;
    a first impurity diffusion layer of the first conductivity type provided in the semiconductor layer and having a second impurity concentration that is higher than the first impurity concentration;
    a first electrode contacting the first impurity diffusion layer;
    a second impurity diffusion layer of a second conductivity type provided in the semiconductor layer so as to surround the first impurity diffusion layer within a first plane that is parallel to the semiconductor substrate, and having a third impurity concentration;
    a second electrode contacting the second impurity diffusion layer; and
    a third impurity diffusion layer of the second conductivity type provided in the semiconductor layer so as to be between the second impurity diffusion layer and the insulating film in a direction orthogonal to the first plane and to contact the second impurity diffusion layer, the third impurity diffusion layer having a fourth impurity concentration that is not less than the third impurity concentration.

2. The semiconductor device according to claim 1, wherein the fourth impurity concentration is higher than the third impurity concentration.

3. The semiconductor device according to claim 1, wherein the second thickness is larger than the first thickness.

4. The semiconductor device according to claim 1, further comprising:
    a fourth impurity diffusion layer of the first conductivity type provided in an upper portion of the second impurity diffusion layer; and
    a gate electrode provided so as to straddle a portion of the second impurity diffusion layer between the semiconductor layer and the fourth impurity diffusion layer, with a gate insulating film in between.

5. The semiconductor device according to claim 4, further comprising a fifth impurity diffusion layer of the first conductivity type provided between the first impurity diffusion layer and the semiconductor layer and having an impurity concentration higher than the first impurity concentration but lower than the second impurity concentration.

6. The semiconductor device according to claim 5, further comprising an element isolation layer extending from an upper surface side of the semiconductor layer through the second impurity diffusion layer to the third impurity diffusion layer so as to surround the first impurity diffusion layer.

7. The semiconductor device according to claim 6, further comprising a fifth impurity diffusion layer of the first conductivity type provided between the first impurity diffusion layer and the semiconductor layer and having an impurity concentration higher than the first impurity concentration but lower than the second impurity concentration.

8. The semiconductor device according to claim 4, further comprising an element isolation layer extending from an upper surface side of the semiconductor layer through the second impurity diffusion layer to the third impurity diffusion layer so as to surround the first impurity diffusion layer.

9. The semiconductor device according to claim 8, further comprising a fifth impurity diffusion layer of the first conductivity type provided between the first impurity diffusion layer and the semiconductor layer and having an impurity concentration higher than the first impurity concentration but lower than the second impurity concentration.

10. The semiconductor device according to claim 1, further comprising an element isolation layer provided in the second impurity diffusion layer and the third impurity diffusion layer so as to surround the first impurity diffusion layer.

11. The semiconductor device according to claim 1 wherein a concentration level of impurities within the second impurity diffusion layer decreases with decreasing distance from the third impurity diffusion layer, and a concentration level of impurities within the third impurity diffusion layer decreases with decreasing distance from the second impurity diffusion layer.

12. The semiconductor device according to claim 1, further comprising;
    a fourth impurity diffusion layer of the first conductivity type provided in an upper portion of the second impurity diffusion layer and connected to the second electrode;
    a gate electrode provided on a portion of the second impurity diffusion layer with a gate insulating film interposed therebetween, the portion of the second impurity diffusion layer being between the semiconductor layer and the fourth impurity diffusion layer.

13. A semiconductor device, comprising:

a semiconductor substrate;

an insulating film provided on the semiconductor substrate and having a first thickness;

a semiconductor layer of a first conductivity type provided on the insulating film and having a second thickness and a first impurity concentration;

a first impurity diffusion layer of a second conductivity type provided in the semiconductor layer and having a second impurity concentration that is higher than the first impurity concentration;

a first electrode electrically contacting the first impurity diffusion layer;

a second impurity diffusion layer of the second conductivity type provided in the semiconductor layer so as to surround the first impurity diffusion layer within a first plane that is parallel to the semiconductor substrate, and having a third impurity concentration;

a second electrode electrically contacting to the upper portion of the second impurity diffusion layer;

a third impurity diffusion layer of the second conductivity type provided in the semiconductor layer so as to be between the second impurity diffusion layer and the insulating film in a directional orthogonal to the first plane and to contact the second impurity diffusion layer, the third impurity diffusion layer having a fourth impurity concentration that is not less than the third impurity concentration;

a fourth impurity diffusion layer of the first conductivity type provided in an upper portion of the second impurity diffusion layer and connected to the second electrode; and a gate electrode provided on a portion of the second impurity diffusion layer with a gate insulating film interposed therebetween, the portion of the second impurity diffusion layer being between semiconductor layer and the fourth impurity diffusion layer.

\* \* \* \* \*